United States Patent [19]
Suda et al.

[11] Patent Number: 5,824,153
[45] Date of Patent: Oct. 20, 1998

[54] APPARATUS WITH MOVABLE ARMS FOR HOLDING A SINGLE-CRYSTAL SEMICONDUCTOR INGOT

[75] Inventors: Ayumi Suda, Chigasaki; Yoshinobu Hiraishi; Koichi Shimomura, both of Omura, all of Japan

[73] Assignee: Komatsu Electronic Metals Co., Ltd, Hiratsuka, Japan

[21] Appl. No.: 762,583

[22] Filed: Dec. 10, 1996

[30]     Foreign Application Priority Data

Dec. 13, 1995  [JP]  Japan .................................. 7-346826

[51] Int. Cl.$^6$ .................................................. C30B 35/00
[52] U.S. Cl. .......................... 117/208; 117/201; 117/202; 117/900
[58] Field of Search ..................... 117/200, 201, 117/202, 208, 218, 900

[56]     References Cited

U.S. PATENT DOCUMENTS 5,089,239  2/1992  Mizuishi et al. ..................... 117/218
5,104,689  4/1992  Hayden et al. ...................... 427/123
5,135,727  8/1992  Ibe ..................................... 117/218

*Primary Examiner*—Felisa Garrett
*Attorney, Agent, or Firm*—Varndell Legal Group

[57]     ABSTRACT

An apparatus for holding a single-crystal semiconductor ingot which is stored in a pulling chamber of a single-crystal semiconductor pulling apparatus is disclosed. The apparatus includes a spindle; a base installed on the spindle and movable along the spindle; a pair of arms for holding the single-crystal semiconductor ingot; means for driving the arms; a pair of sensors for detecting the distance between the ingot and the arms; and a controller for driving the arms to the ingot according to the sensors; when each of the arms is detected to have a predetermined distance from the ingot, the controller stopping the movement of the arm; when both the arms have the predetermined distance to the ingot, the controller driving simultaneously both the arms to the ingot surface, thereby holding the ingot.

13 Claims, 7 Drawing Sheets

APPARATUS WITH MOVABLE ARMS FOR HOLDING A SINGLE-CRYSTAL SEMICONDUCTOR INGOT

BACKGROUND OF THE INVENTION

1. Field of the Invention:

The present invention relates to an apparatus and a method for holding a single-crystal semiconductor ingot which is produced by and removed from a pulling apparatus of single-crystal semiconductor.

2. Description of Related Art:

Semiconductor devices are formed on a substrate of high-purity single-crystal semiconductor which is fabricated by, for example, pulling a cylindrical single-crystal ingot from the melt in a crucible, as well-known as Czochralski (hereafter CZ) method. In the CZ method, polysilicon material is charged in the crucible inside the main chamber of a single-crystal semiconductor pulling apparatus. The polysilicon material is melted by means of heaters around the crucible. Then a seed held by a seed holder is immersed in the melt, and is pulled in spinning in the same or reverse direction of the crucible to form the single-crystal semiconductor.

The upper portion of the main chamber is connected to a pulling chamber in which the grown single-crystal semiconductor ingots are stored. The ingots must be removed from the pulling chamber for further processing, such as grinding and slicing.

As the dimensions of the ingots fabricated by the CZ method increase, the weights of the ingots, for example, 8-inch ingots, have exceeded 60–100 kg. Since a diameter of a seed portion as upper portion of single crystal ingots is as small as 2–5 mm for eliminating dislocation faults in the ingot, the slight vibration caused by removing the grown ingots from the pulling chamber will break the seed. When the broken seed falls in the crucible, not only the operator is in danger but the pulling apparatus may be damaged.

Moreover, when the single-crystal semiconductor ingot is removed from the pulling apparatus, it must be supported by hand to prevent falling. However, to transfer such a heavy and slippery material by hand is not appropriate.

Furthermore, it is dangerous to land the removed single-crystal semiconductor ingot which is pulled out the pulling apparatus to the ground. It requires a lot of labor forces. In addition, if the ingot falls or overturns, the expensive ingot will be damaged, and the workers will be hurt. Another problem is that the heavy and hot ingots cannot be removed from the pulling chamber for further processing until they are cooled, thus affecting the manufacturing efficiency.

Apparatus for removing the ingots from the pulling chamber without handwork are therefore disclosed in Japanese Utility Model Publication No. 47-42513, Japanese Patent Publication No. 5-57234, and Japanese Patent Application Laid-Open No. 3-218933.

However, the apparatus disclosed in Japanese Utility Model Publication No. 47-42513 is a part of the single-crystal semiconductor pulling apparatus. Therefore the pulling apparatus must be enlarged and becomes more complicated. Moreover, since the removed ingots are transferred by carts, the efficiency is reduced. In Patent No. 5-57234, each pulling apparatus must be provided with an apparatus for removing the ingots, and the removed ingots are transferred by carts. Moreover, the apparatus disclosed in the three patents cannot hold any ingot if the ingot does not locate in the center of the apparatus. Experience is required to fix the ingot in the center of the apparatus. Furthermore, if the ingot is not precisely aligned and held, the ingot will break and drop, thereby introducing more danger.

SUMMARY OF THE INVENTION

Accordingly, the present invention provides an apparatus and a method for holding a single-crystal semiconductor ingot without modification to a conventional pulling apparatus.

The apparatus and method of the present invention are provided with alignment function for automatically holding a single-crystal semiconductor ingot, thereby improving the performance, efficiency and safety.

The present invention therefore provides a single crystal ingot holding apparatus for taking out from a semiconductor single crystal pulling apparatus a single crystal ingot which has been pulled up by the semiconductor single crystal pulling apparatus, and conveying the single crystal ingot, comprising: a shaft: a base installed on the shaft and movable along the shaft in a vertical direction; at least one pair of holding arms installed on the base, for holding at tip ends thereof an outer periphery of the single crystal ingot from opposite sides; drive means for independently driving each holding arm; sensors each being disposed on each arm, for detecting a fact that a holding surface of each arm has reached at a predetermined distance from the outer periphery of the single crystal ingot; and control means for controlling to stop or drive each of the holding arms in response to detection signals from the sensors and, when detected that all of the holding arms are positioned at the predetermined distance from the outer periphery of the single crystal ingot, for simultaneously starting the drive of each pair of holding arms to hold the single crystal ingot by each pair of the holding arms.

Each pair of the holding arms preferably include a pair of flat holding members which are disposed to face with each other and capable of being independently driven so as to contact with the outer periphery of the single crystal ingot.

Preferably at least inside of each of the holding members is configured with an elastic material.

Preferably the holding arms are so installed that a distance from the shaft is freely adjustable.

Preferably, the holding arms are installed to be rotatable about the shaft.

Preferably, the shaft is stood up vertically on a cart which is movable in a horizontal direction.

Preferably, the cart supports the base with the holding arms attached, in such a manner that the base is rotatable about the shaft along with the shaft.

Preferably, the drive means comprises an solenoid-operated valve disposed in an air passage where air supplied from a pressure air source passes through and an air cylinder connected to the air passage and driven by switching operations of the solenoid-operated valve, and wherein the drive means is so arranged that, along with the extension/contraction of the air cylinder, a distance from the single crystal ingot can be adjusted by independently sliding each arm on a linear guide.

Preferably, the drive means comprises a pressure switch for realizing the supply of the air from the pressure air source to the air passage by switching over the switch, a directional control check valve for preventing an air flow in a reverse direction in the air passage, and air pressure maintaining means including a buffer tank for adjusting the air flow.

Preferably, the apparatus further comprising a reinforcement arm, one end thereof being supported on the shaft and the other end thereof being detachably secured on an outer periphery of a pull chamber of the semiconductor single crystal pulling apparatus.

Preferably, the predetermined distance is set to 5 mm.

Preferably, the sensors are optical sensors.

A method of holding a single crystal ingot, comprising the steps of: moving at least one pair of holding arms to a position where the single crystal ingot is to be sandwiched; driving each of the holding arms toward a direction of the single crystal ingot by drive means; temporarily stopping each of the holding arms in response to detection signals from sensors, when each holding face of each holding arm approaches to a predetermined distance from an outer periphery of the single crystal ingot; and holding the single crystal ingot by simultaneously driving each of the holding arms, when all of the holding faces of the holding arms have reached the predetermined distance from the outer periphery of the single crystal ingot.

Moreover the predetermined distance is set to 5 mm.

The present invention therefore provides the following advantages.

1. Since the apparatus for holding the single-crystal semiconductor ingot is independently arranged on the spindle of the pulling apparatus, no modification is required in the pulling apparatus. Therefore, the pulling apparatus will not be enlarged and complicated.

2. The arms are driven independently. Any arm reaches the predetermined distance to the ingot surface as detected by the sensors, the arm is stopped. When both the arms have reached the predetermined positions, they are driven to contact the ingot at the same time. Therefore, the ingot can be held vertically, and the apparatus does not require the alignment process.

3. The arms include hold elements arranged face to face around the ingot. Since they are plates and driven independently, neither alignment task nor good experience is required. Therefore, the manufacturing efficiency can be improved.

4. Since the hold elements are made of heat-resistant rubber which has high friction coefficient, the hold force is increased.

5. In the present invention, the means for driving the arms includes an solenoid-operated valve located in an air passage from an pressure air source, and an air cylinder which is connected to the air passage for driving the arms according to the state of the solenoid-operated valve, thereby moving the arms along a linear guide element to adjust the distance between the arm and the ingot. Moreover, the means for driving the arms further includes a pressure switch for controlling the air provided from the pressure air source to the air passage; a valve for preventing the air flowing back in the air passage; and a buffer tank for regulating the pressure of the air in the air passage. Therefore, the base provided with the arms has the air passage to prevent the ingot dropping. That is, even though the air pipes may be loose due to vibration of the base or the cart, or the air pressure reduced when the air compressor cannot work, the driving force to the arms does not reduce, and the holding force is retained, thereby holding continuously and precisely the ingot.

6. The method of the invention holds a single-crystal semiconductor ingot by means of a pair of arms. The arms are driven to the ingot. When anyone of the arms is detected to have a predetermined distance to the ingot, the arm is stopped. Since both the arms have the common process, the ingot is aligned automatically to the holding apparatus. Therefore, the ingot can be held vertically, and the apparatus does not suffer any unbalanced force from the ingot. The seed portion of the ingot will not be broken.

DETAILED DESCRIPTION OF THE INVENTION

Figure 1:
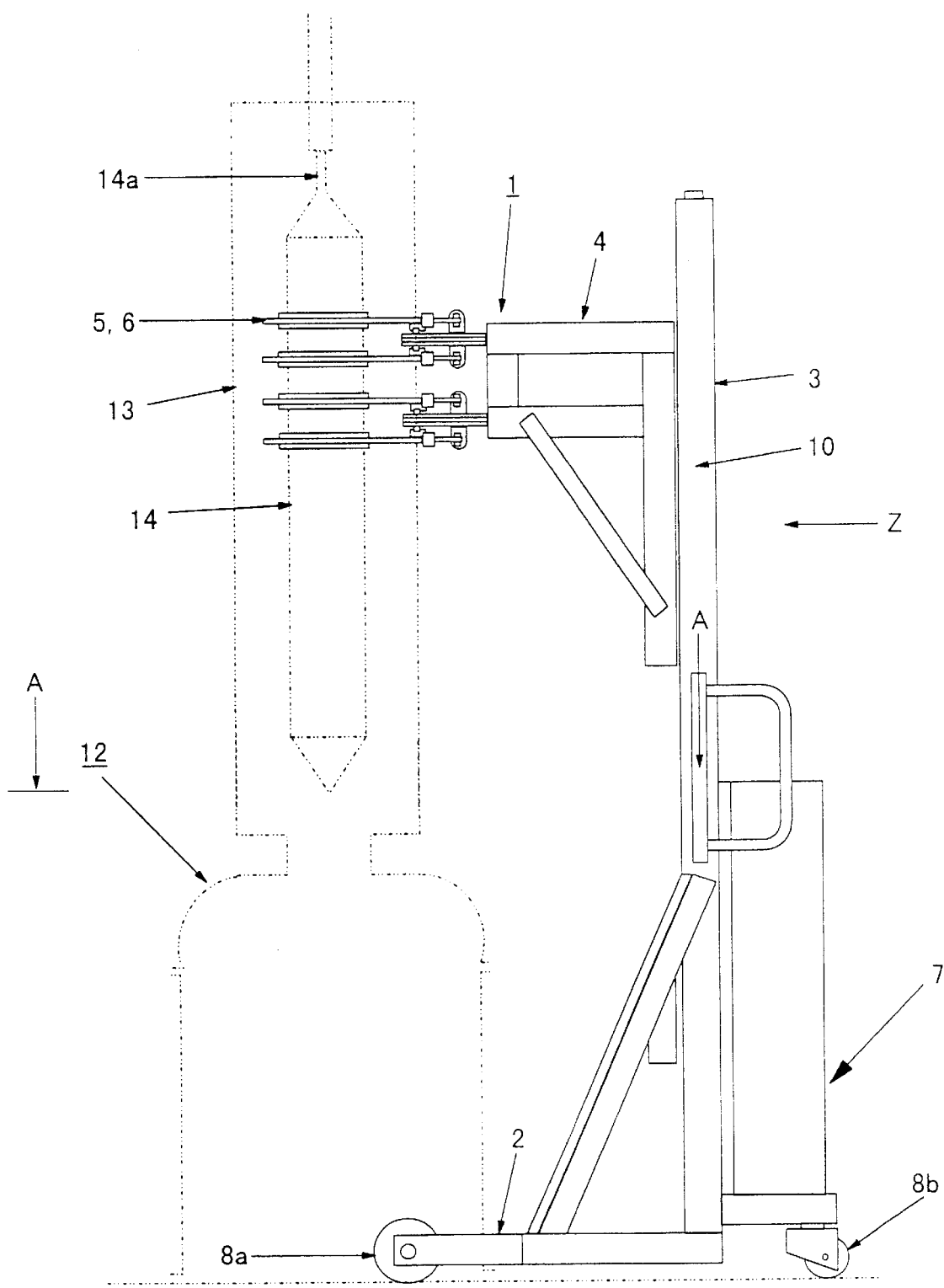
FIG. 1 is a schematic diagram illustrating the apparatus for holding a single-crystal semiconductor ingot according to a first embodiment of the invention.
Figure 2:
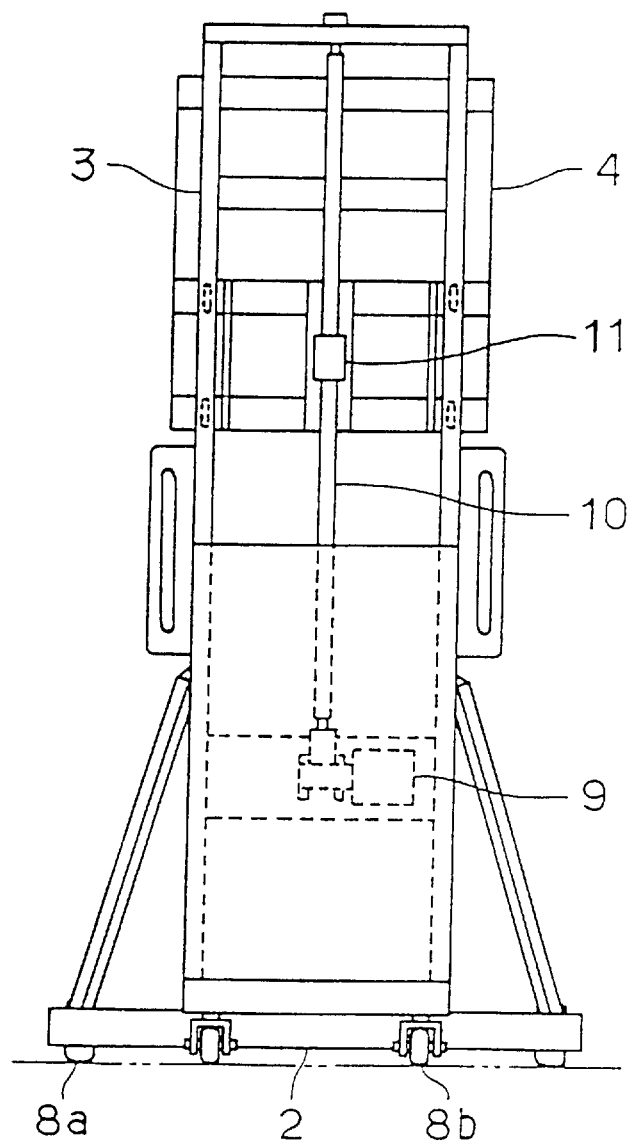
FIG. 2 illustrates the apparatus of FIG. 1 along the Z-direction.

The embodiment of the present invention will be described in accompaniment with the drawings. FIG. 1 illustrates the apparatus for holding a single-crystal semiconductor ingot according to the first embodiment. FIG. 2 is a side view of the apparatus along the Z-direction in FIG. 1. The apparatus includes a cart 2 which is horizontally movable, a frame 3 arranged on the spindle 10 of the cart 2, a base 4 which is installed on the frame 3 and is movable vertically, four pairs of arms 5 and 6 installed in front end of the base 4, and a controller 7 placed on the cart 2. The cart 2 is movable as it is provided with wheels 8a and 8b. Moreover, referring to FIG. 2, a driver (motor) 9 mounted upon the frame 3 drives a screw spindle 10 to move the base 4 up or down by means of a rolling ball 11 engaged in the screw spindle 10. The base 4 can reach to the height at which the single-crystal semiconductor ingot 14 stored in the pulling chamber 13 of the pulling apparatus 12 is to be held.

Figure 3:
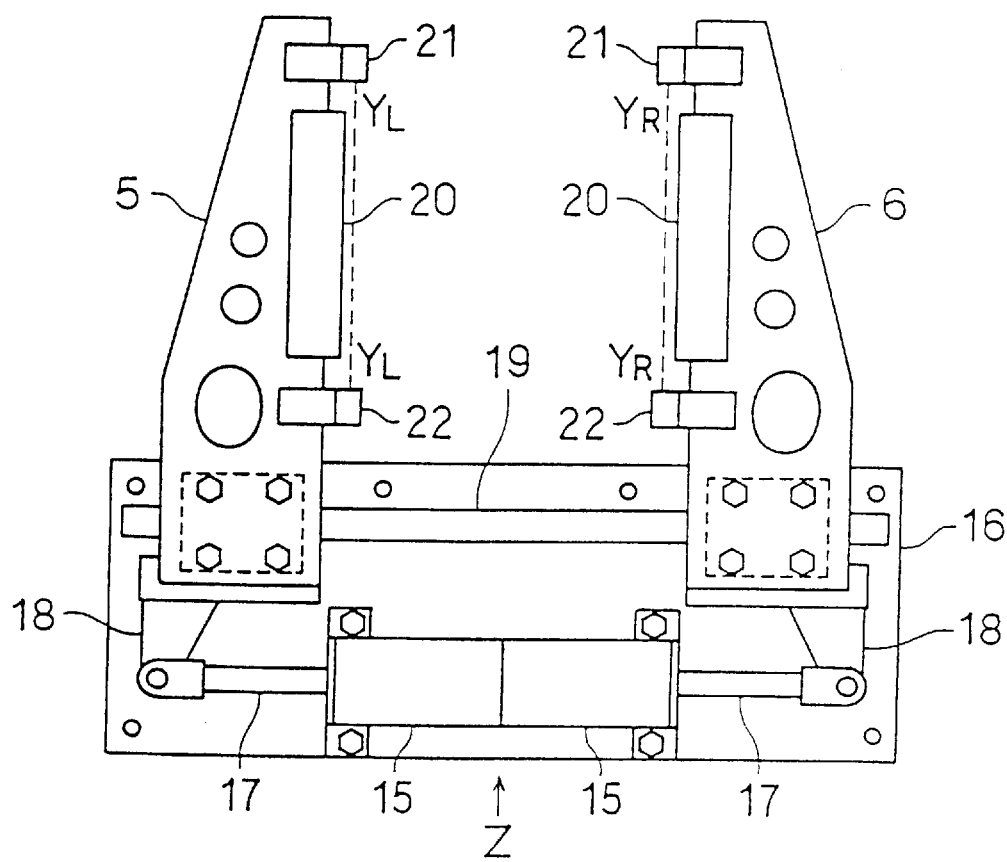
FIG. 3 is a top view of the arms in the apparatus of FIG. 1.
Figure 4:
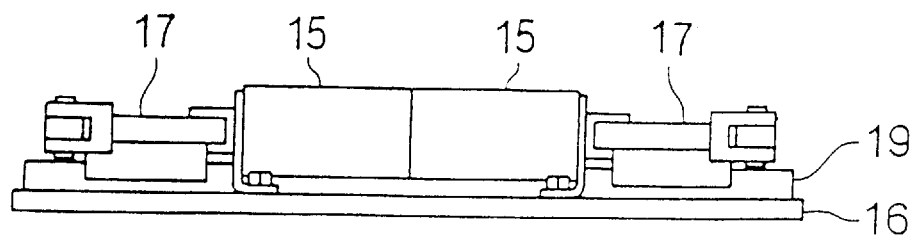
FIG. 4 illustrates the arms in FIG. 3 along the Z-direction.

FIG. 3 illustrates a pair of arms of the embodiment. FIG. 4 is a side view of them along the Z-direction in FIG. 3. A plate 16 is provided at the front end of the base 4. Two air cylinders 15 and a pair of arms 5 and 6 are arranged on the plate 16. The air cylinders 15 are arranged back to back so that the piston rod 17 is aligned in a line. The piston rod 17 are connected to the bases of the arms 5 and 6 by means of connectors 18. Linear guide elements 19 are provided on the plate 16 for engaging the bases of the arms 5 and 6. The arms are a pair of plates arranged face to face around the ingot, and are driven independently. The arms therefore move along the linear elements 19 as driven by the air cylinders 15. Moreover, the regions where the arms contact the ingot are provided with heat-resistant hold elements 20 made of rubber. Both sides of the hold elements 20 are provided with emitter 21 and receiver 22 of a photo sensor. Each of the axis YL-YL and YR-YR from the emitter 21 to the receiver 22 of the photo sensor has a distance of about 5 mm from the surface of the hold element 20.

Figure 5:
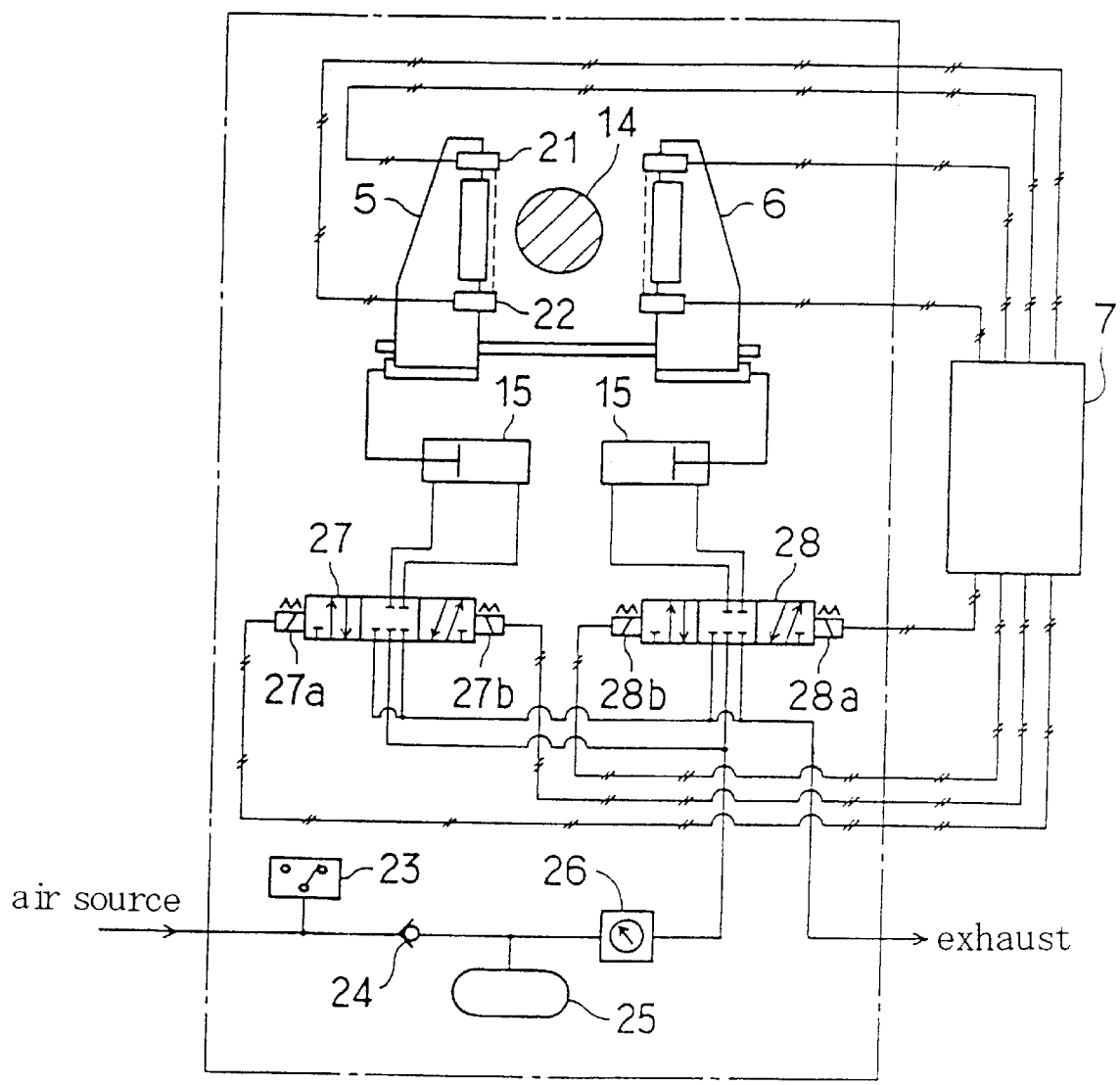
FIG. 5 illustrates the circuit for controlling the arms.

The circuit for controlling the arms is illustrated in FIG. 5. The closed region inside the dashed line means the base 4. The air cylinders 15 is driven by an air compressor on the cart 2 or by an external pressure air source. The driving air goes through pressure switch 23, directional control check valve 24, buffer tank 25, regulator 26, solenoid-operated valve 27 or 28 and then reaches the air cylinder 15. Moreover, the emitter 21 and receiver 22 of the photo sensors on the arms 5 and 6, the coils 27a and 27b of the solenoid-operated valve 27, the coils 28a and 28b of the solenoid-operated valve 28, and the controller 7 are wired together.

The aforementioned air passage, even though the air pipes are loose due to vibration of the base 4 or the air compressor cannot work, retains a predetermined driving pressure by means of the pressure switch 23, directional control check valve 24 and the buffer tank 25. Therefore, the ingot held by the apparatus will not drop.

The method for holding the ingot will be described in accompaniment with FIG. 1, FIG. 5 and FIG. 6.

1. Referring to FIG. 1, the ingot 14 fabricated by the pulling apparatus 12 is pulled up to the pulling camber 13. The door of the pulling chamber 13 is opened as the interior of the pulling apparatus 12 is cooled.

2. The cart 2 is moved to the pulling apparatus 12. The base 4 is then elevated to the most appropriate position for the arms 5 and 6 to remove the ingot15.

3. The position of the cart 2 is modified so that the arms 5 and 6 are placed to sandwich the ingot therebetween.

Figure 6A:
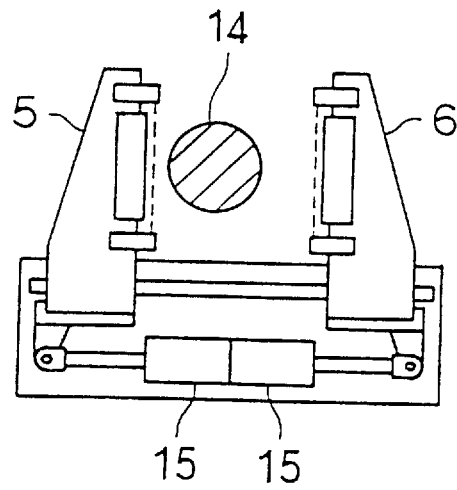
FIG. 6A through FIG. 6D are schematic diagrams illustrating the operation of the arms.

4. A switch (not shown in the figures) on the controller is turned on to automatically test the photo sensors and the driving pressure air source. The coils 27a of the solenoid-operated valve 27 and the coils 28a of the solenoid-operated valve 28 are excited, if the test is passed, and then the air is provided to air cylinders 15, as shown in FIG. 6A. Therefore, the arms 5 and 6 are driven to hold the ingot.

Figure 6B:
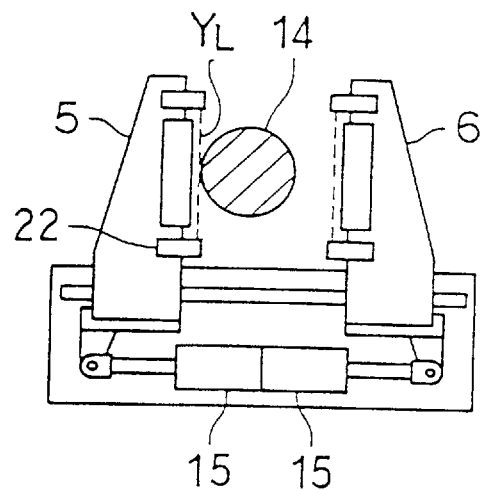

5. Referring to FIG. 6B, when any of the axis of the photo sensors intersects with the outer periphery of the ingot, for example, the axis YL of the left arm 5 intersects, an output signal of the receiver 22 is immediately sent to the controller 7. The controller 7 releases the excited state of the coils 27a of the solenoid-operated valve 27 so as to stop the movement of the left arm 5. Whereas the other arm keep moving to the ingot until the outer periphery of the ingot is detected by the photo sensor.

Figure 6C:
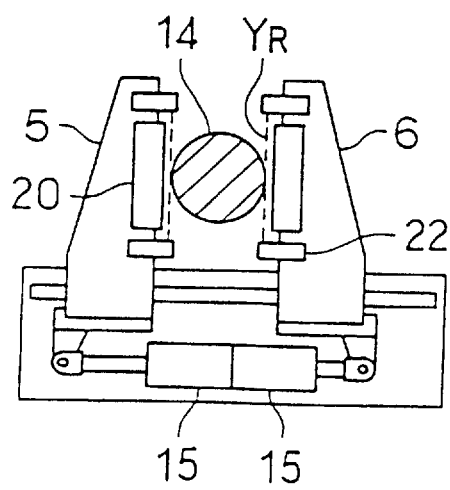

6. Referring to FIG. 6C, when the axis YR of the photo sensor on the right arm 6 intersects with the outer periphery of the ingot 14, the receiver 22 on the right arm 6 sends a signal to the controller 7. According to the signal The controller 7 releases the excited state of the coils 28a of the solenoid-operated valve 28 and stops the movement of the air cylinders 15 which drive the right arm 6. Then the surfaces of the hold element 20 on two arms 5 and 6 have a equal distance of about 5 mm to the ingot surface.

Figure 6D:
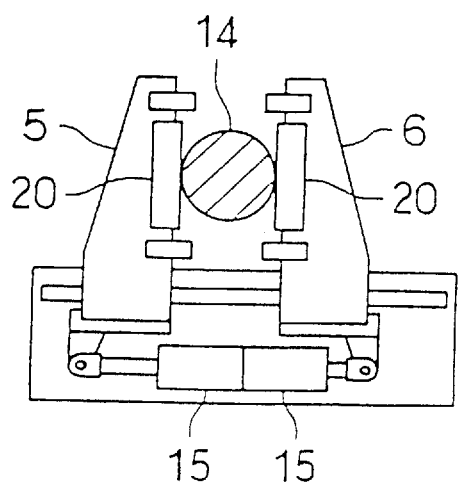

7. A counter of the controller 7 starts after passing 1–2 seconds after the stop of right arm 6. At that time, referring to FIG. 5, the coils 27a of the solenoid-operated valve 27 and the coils 28a of the solenoid-operated valve 28 are excited again, and the air is driven to the air cylinders 15. Referring to FIG. 6D, both the arms 5 and 6, which stop with an equal distance to the ingot, move simultaneously to the ingot, and hold both sides of the ingot 14 by the hold elements 20 as the ingot is static.

If the friction coefficient between the hold element 20 and the ingot 14 is $\mu$, and the force exerted by the hold element 20 to the ingot 14 is P, the holding force is $F=\mu P$. Since the present invention utilizes rubber as hold element 20, and the rubber has a high friction coefficient, it provides a very big holding force.

When the ingot 14 is precisely held by the apparatus 1, the seed portion 14a of the ingot 14 is cut. The cart 2 draws back to remove the ingot 14 from the pulling chamber 13. The base 4 is then dropped to the appropriate height for transferring the ingot 14. When the ingot 14 is moved to the predetermined position, a release switch on the controller 7 is turned on. Referring to FIG. 5, the coils 27b of the solenoid-operated valve 27 and the coils 28b of the solenoid-operated valve 28 are excited to move the arms 5 and 6 to outside to release holding from the ingot 14. If the ingot 14 is stored horizontally, the apparatus merely rotates 90-degree as it reaches the predetermined position for storing. Since the mechanism for rotating the apparatus is known to those skilled in the art, the description is omitted.

In the method of the present invention, since the hold elements are made of plates, no alignment process is required. Moreover, as the inside of plates are made of rubber which is an elastic material, they can hold the ingot easily and tightly. Therefore, modifying the position of the cart is not that important. Even if the ingot is not in the center of the apparatus, or the operator is lack of experience, the ingot can be held. Furthermore, since both the arms reach the ingot surface at the same time after each arm with an equal distance to the periphery of the ingot, the ingot is really vertically held by the apparatus of the invention.

The apparatus and method for holding the single-crystal semiconductor ingot of the invention can be applied in the FZ method for fabrication single-crystal semiconductor.

Even though the present embodiment utilizes heat-resistant rubber which is high friction coefficient as the hold elements 20 for inside of the arms 5 and 6, they can be replaced by any heat-resistant and elastic material for inside at least. For example, they can be metal plate springs. Moreover, the whole arm can be made of rubber.

In the aforementioned embodiment, the apparatus 1 is mounted on the cart 2, and removes the ingot 14 with a distance to the pulling apparatus 12. In face, the arms 5 and 6 or the base 4 can be extensible from the spindle 10 to reach the ingot, thus further simplifying the structure of the apparatus instead of the cart 2. Or, the arms 5 and 6 can be rotary with respect to the spindle 10 instead of the cart 2. Therefore, the ingot 14 can be removed and transferred more easily.

The predetermined distance from the arms to the ingot is about 5 mm in the aforementioned embodiment. This predetermined value is adjustable. It can be larger than 5 mm. Or the arms are stopped as they slightly contact the ingot surface.

Moreover, even though the embodiment utilizes photo sensors to detect the distance between the arms and the ingot, heat sensors or contact sensors can also be utilized.

Figure 7:
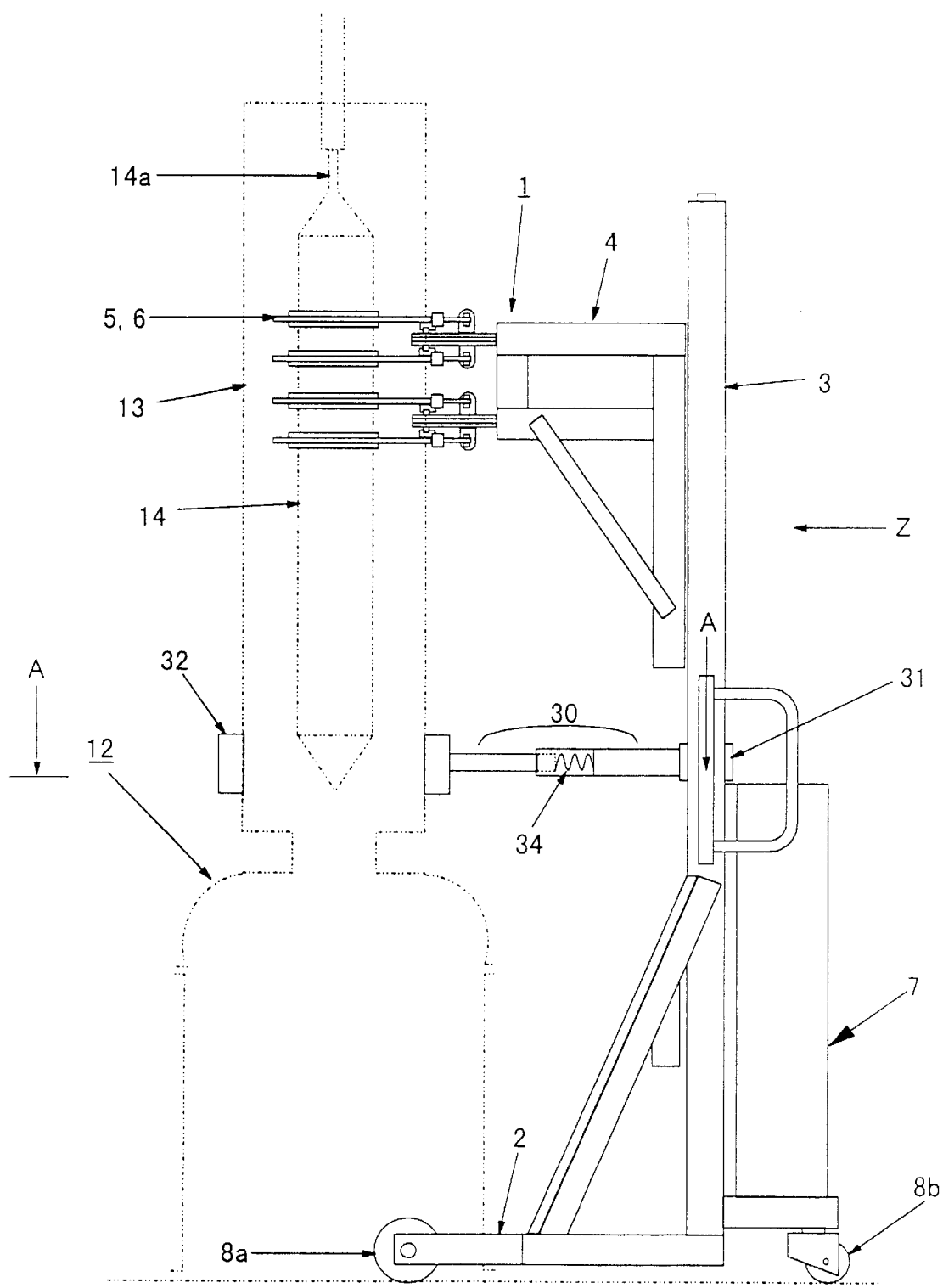
FIG. 7 illustrates a second embodiment of the invention.
Figure 8:
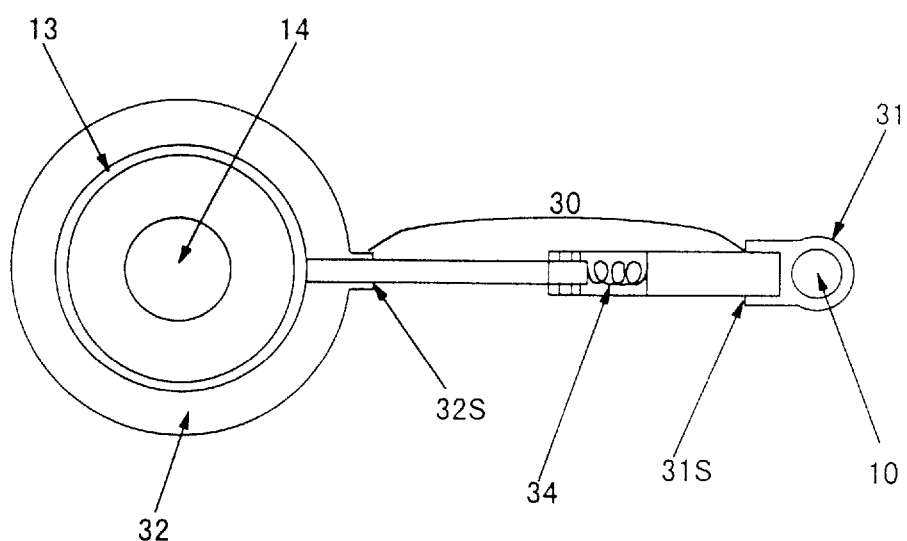
FIG. 8 is a cross-sectional view of the apparatus in FIG. 7 along the line A—A.

FIG. 7 illustrates a second embodiment of the invention. An enforcement arm 30 is introduced in the apparatus removable. The reinforcement arm 30 is connected between the spindle and the pulling chamber of the pulling apparatus. The holding process of the ingot can be improved by means of the reinforcement arm 30. The reinforcement arm 30 can be removed as the cart moves. For example, referring to FIG. 8, rings 31 and 32 around the spindle 10 and the pulling chamber 14 respectively are provided with grooves 31S and 32S for supporting the reinforcement arm 30. The reinforcement arm 30, which can engage in the grooves 31S and 32S, includes two portions connected extensibly by a spring 34. When the apparatus is holding the ingot, the reinforcement arm 30 is set up to improve the process. When the ingot is held to be transferred, the reinforcement arm 30 can be removed.

What is claimed is:

1. A single crystal ingot holding apparatus for taking out from a semiconductor single crystal pulling apparatus a single crystal ingot which has been pulled up by the semiconductor single crystal pulling apparatus, and conveying the single crystal ingot, comprising:

a shaft;

a base installed on the shaft and movable along the shaft in a vertical direction;

at least one pair of holding arms installed on the base for holding at tip ends thereof an outer periphery of the single crystal ingot from opposite sides;

drive means for independently driving each holding arm;

sensors disposed on the holding arms for detecting a position where a distance between one of the holding arms and the outer periphery of the single crystal ingot is equal to a distance between another of the holding arms and the outer periphery of the single crystal ingot; and control means for controlling to stop or drive each of the holding arms in response to detection signals from the sensors and, when the position is detected, for simultaneously starting the drive of each pair of holding arms to hold the single crystal ingot by each pair of the holding arms.

2. The apparatus as claimed in claim 1, wherein each pair of the holding arms comprises a pair of flat holding members which are disposed to face with each other and capable of being independently driven so as to contact with the outer periphery of the single crystal ingot.

3. The apparatus as claimed in claim 2, wherein the holding arms are so installed that a distance form the shaft is freely adjustable.

4. The apparatus as claimed in claim 1, wherein at least inside of each of the holding members is configured with an elastic material.

5. The apparatus as claimed in claim 1, wherein the holding arms are so installed that a distance between the holding arms and the shaft is freely adjustable.

6. The apparatus as claimed in claim 1, wherein the holding arms are installed to be rotatable about the shaft.

7. The apparatus as claimed in claim 1, wherein the shaft is stood up vertically on a cart which is movable in a horizontal direction.

8. The apparatus as claimed in claim 6, wherein the cart supports the base with the holding arms attached, in such a manner that the base is rotatable about the shaft along with the shaft.

9. The apparatus as claimed in claim 1, wherein the drive means comprises an solenoid-operated valve disposed in a air passage where air supplied from a pressure air source passes through and an air cylinder connected to the air passage and driven by switching operations of the solenoid-operated valve, and wherein the drive means is so arranged that, along with the extension/contraction of the air cylinder, a distance between the single crystal and the holding arms can be adjusted by independently sliding each arm on a linear guide.

10. The apparatus as claimed in claim 9, wherein the drive means comprises a pressure switch for realizing the supply of the air from the pressure air source to the air passage by switching over the switch, a directional control check valve for preventing an air flow in a reverse direction in the air passage, and air pressure maintaining means including a buffer tank for adjusting the air flow.

11. The apparatus as claimed in claim 1, further comprising a reinforcement arm, one end thereof being supported on the shaft and the other end thereof being detachably secured on an outer periphery of a pull chamber of the semiconductor single crystal pulling apparatus.

12. The apparatus as claimed in claim 1, wherein the position detected by the sensors is when holding surfaces of the holding arms are 5 mm from the outer periphery of the single crystal ingot.

13. The apparatus as claimed in claim 1, wherein the sensors are optical sensors.

* * * * *